United States Patent
Ali (10) Patent No.: US 6,778,013 B1
(45) Date of Patent: Aug. 17, 2004

(54) BUFFER AMPLIFIER STRUCTURES WITH ENHANCED LINEARITY

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/371,780

(22) Filed: Feb. 21, 2003

(51) Int. Cl.[7] .............................. H03F 3/45; H03F 3/04
(52) U.S. Cl. ..................................... 330/252; 330/311
(58) Field of Search .................................. 330/252, 311

(56) References Cited

U.S. PATENT DOCUMENTS

| | | | |
|---|---|---|---|
| 3,903,479 A | * | 9/1975 | Limberg ..................... 330/288 |
| 4,004,091 A | * | 1/1977 | Marley et al. ............. 178/70 R |
| 5,574,403 A | | 11/1996 | Kolluri |
| 5,637,993 A | * | 6/1997 | Whitney et al. ............. 323/315 |
| 5,812,026 A | | 9/1998 | Fairgrieve |
| 5,939,937 A | | 8/1999 | Terietzki |
| 5,963,156 A | | 10/1999 | Lewicki et al. |
| 6,028,459 A | | 2/2000 | Birdsall et al. |
| 6,046,875 A | | 4/2000 | Siniscalchi et al. |
| 6,121,818 A | * | 9/2000 | Kim et al. .................. 327/359 |
| 6,208,177 B1 | | 3/2001 | Knoedl et al. |
| 6,392,490 B1 | * | 5/2002 | Gramegna et al. .......... 330/296 |
| 6,429,700 B1 | | 8/2002 | Yang |

* cited by examiner

Primary Examiner—Patricia Nguyen
(74) Attorney, Agent, or Firm—Koppel, Jacobs, Patrick & Heybl (57) ABSTRACT

Buffer amplifiers are provided with a replica current generator that supplements a buffer transistor and is configured to provide a replica current which substantially equals required load currents in the amplifier's output load. Because the current of the buffer transistor remains constant, its base-emitter voltage $V_{be}$ remains constant and the amplifier linearly reproduces the input signal $S_{in}$ across the output load.

20 Claims, 6 Drawing Sheets

BUFFER AMPLIFIER STRUCTURES WITH ENHANCED LINEARITY

BACKGROUND OF THE INVENTION

1. Field of the Invention

The present invention relates generally to buffer amplifiers.

2. Description of the Related Art

The principal purpose of buffer amplifiers is to provide isolation while coupling signals between a preceding electronic circuit and a succeeding electronic circuit. Accordingly, a perfect buffer amplifier presents an infinite impedance to the preceding circuit and has zero output impedance and infinite bandwidth to facilitate driving the succeeding circuit. If the preceding circuit provides an input voltage $V_{in}$, the perfect buffer amplifier supplies the current required to drive the succeeding circuit and provides an output voltage $V_{out}$ equal (although possibly offset) to the input voltage $V_{in}$.

Buffer amplifiers are essential elements in a great variety of signal-conditioning systems (e.g., analog-to-digital converters). Because real buffer amplifiers fail to provide the ideal parameters described above, their transfer functions generally exhibit nonlinearity so that they insert distortion into the output voltage $V_{out}$ and thus degrade the performance of these systems.

Although this distortion can be reduced by increasing transistor bias currents to greatly exceed signal currents (thus reducing the relative effect of the signal current variations), this modification significantly degrades the buffer amplifier's efficiency. If the buffer amplifier's output load is capacitive, linearity will still degrade with increased signal frequency because of the increased current demand that is required to drive the load capacitance at higher frequencies.

BRIEF SUMMARY OF THE INVENTION

The present invention is directed to buffer amplifiers that realize enhanced linearity.

These goals are realized with a replica current generator that supplements a buffer transistor and is configured to provide a replica current which substantially equals required load currents in the amplifier's output load. Because the current of the buffer transistor 24 now remains constant, its base-emitter voltage $V_{be}$ remains constant and the amplifier linearly reproduces the input signal $S_{in}$ across the output load.

The novel features of the invention are set forth with particularity in the appended claims. The invention will be best understood from the following description when read in conjunction with the accompanying drawings.

DETAILED DESCRIPTION OF THE INVENTION

The present invention recognizes that the observed nonlinearity of buffer amplifiers is typically a result of current variation in transistors as they attempt to supply the current required by the buffer amplifier's output load. The invention further recognizes that these current variations induce changes in transistor parameters (e.g., base-emitter voltage $V_{be}$) that directly generate distortion in the buffer amplifier's output voltage.

In response to these recognitions, the invention injects the required current variations with a replica current generator so that other buffer currents remain substantially constant and, as a result, distortion is significantly reduced. The need for significantly increasing transistor bias currents to reduce distortion is thus avoided with consequent enhancement of buffer efficiency.

Figure 1:
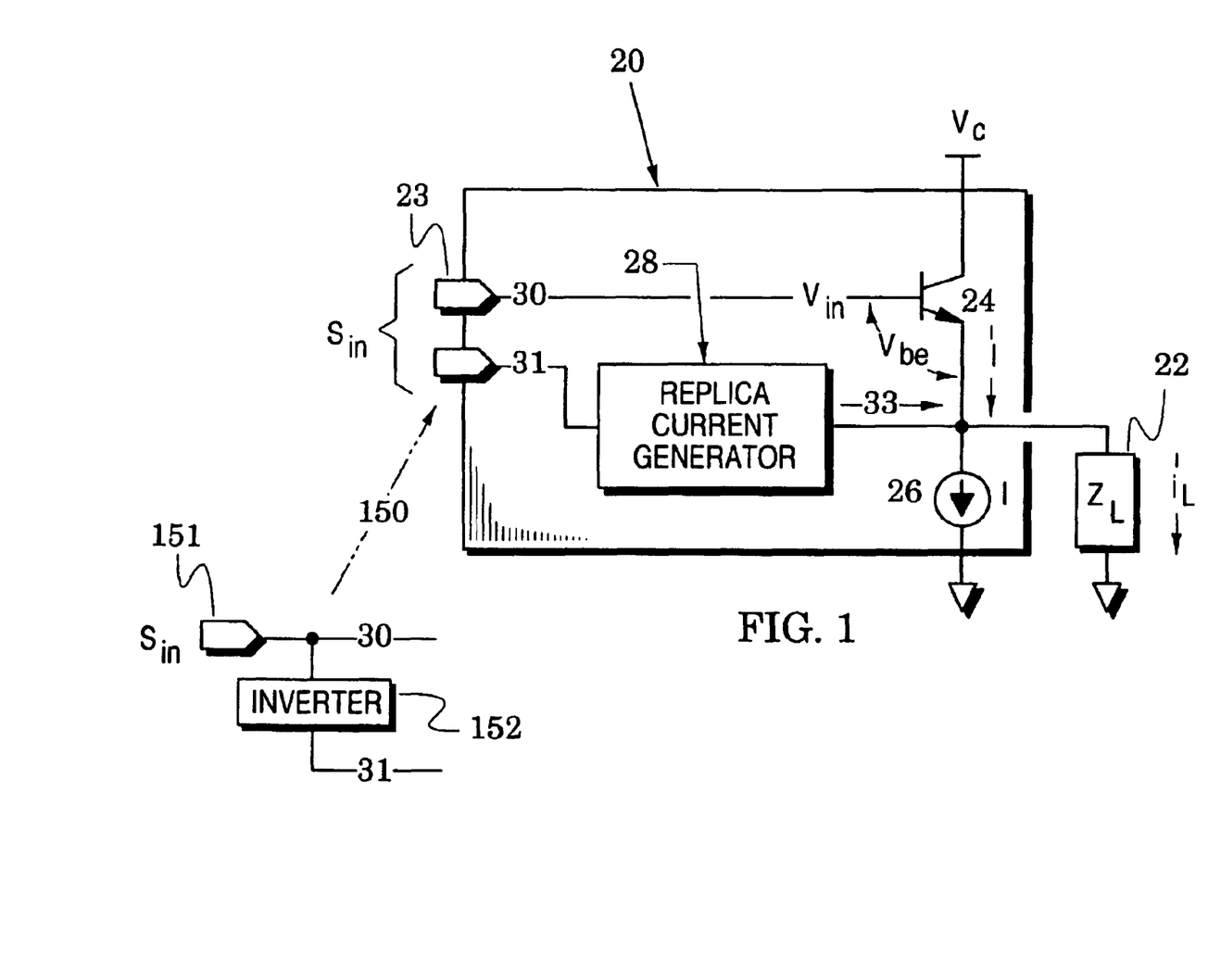
FIG. 1 is a schematic of a buffer amplifier embodiment of the present invention.

In particular, FIG. 1 illustrates a buffer amplifier 20 which drives an output load 22 in response to a differential input signal $S_{in}$ at an input port 23. The amplifier includes a buffer transistor 24, a buffer current source 26 that provides a bias current I and a replica current generator 28.

The emitter of the buffer transistor 24 is available to provide a load current $i_L$ to the output load 22 when the buffer transistor's base receives an upper side 30 of the differential input signal $S_{in}$. The buffer current source 26 is coupled to the buffer transistor's emitter and the replica current generator 28 is coupled between a lower side 31 of the differential input signal $S_{in}$ and the output load 22.

The replica current generator 28 is configured to provide a replica current 33 that is substantially equal to the required load current $i_L$ and, accordingly, the current through the buffer transistor 24 remains substantially constant and equal to the bias current I of the buffer current source 26.

Because the current of the buffer transistor 24 is constant, its base-emitter voltage $V_{be}$ is constant and, since the voltage across the output load 22 is the input voltage $V_{in}$ of the upper side 30 (voltage between the upper side and circuit ground) plus $V_{be}$, the output voltage is now a faithful (although offset) copy of the input voltage $V_{in}$. The replica current generator 28 thus supplies the load current $i_L$ so that the buffer transistor 24 can accurately transfer the input voltage $V_{in}$ to the output load 22.

Figure 2A:
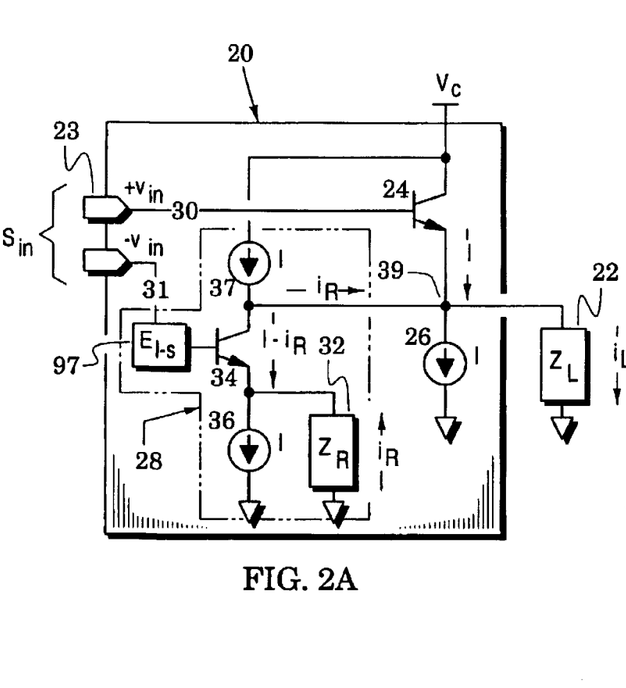
FIGS. 2A and 2B are schematics of another buffer amplifier embodiment and its responses to different phases of a differential input signal.
Figure 2B:
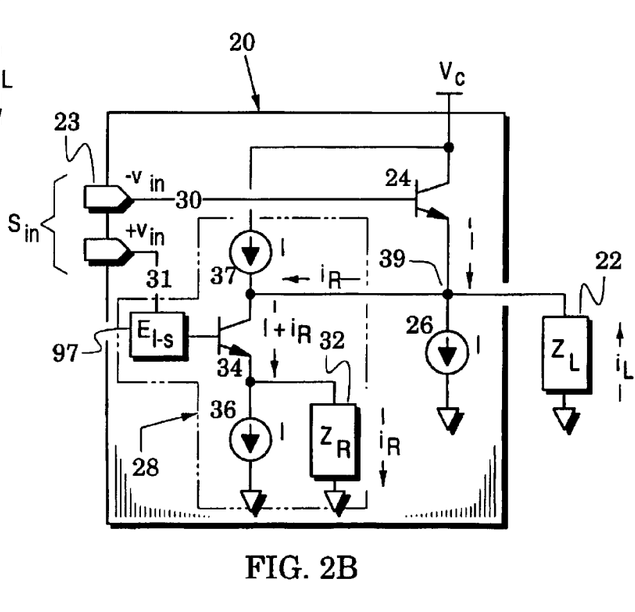

An embodiment of the replica current generator 28 is shown in the buffer amplifier 20 of FIGS. 2A and 2B which otherwise include elements of FIG. 1 with like elements indicated by like reference numbers. In this embodiment, the replica current generator 28 includes a replica load 32, a replica transistor 34 and first and second replica current generators 36 and 37.

The replica transistor's base receives the lower side 31 of the differential input signal $S_{in}$, its emitter is coupled to the replica load 32 and the first replica current source 36 and its collector is coupled to the second replica current source 37 and to the emitter of the buffer transistor 24. The first and second replica current sources each preferably provide the same bias current I that is provided by the buffer current source 26 and, in another important feature of the invention, the impedance of the replica load 32 substantially matches the impedance of the buffer load 22.

FIG. 2A illustrates a first phase of the input signal $S_{in}$ in which the lower side 31 is at a low voltage $-V_{in}$ relative to a high voltage $+V_{in}$ at the upper side. In contrast, FIG. 2B illustrates an opposite second phase of the input signal $S_{in}$ in which the lower side 31 is at a high voltage $+V_{in}$ relative to a low voltage $-V_{in}$ at the upper side. The buffer amplifier 20 must generate required load currents $+i_L$ (in FIG. 2A) and $-i_L$ (in FIG. 2B) in the buffer load 22 as the voltage of the upper side 32 successively rises above and drops below the lower side 31, At the same times, the voltage of the lower side 31 drops and rises and induces (via the replica transistor 34) an upward replica current $i_R$ in the replica load 32 (in FIG. 2A) and a downward replica current $i_R$ (in FIG. 2B). Because the replica current source 36 provides a bias current I to the replica transistor's emitter, the current through the replica transistor 34 thus alternates between $I - i_R$ and $I + i_R$. Because the second replica current source 37 provides a bias current I to the replica transistor's collector, a replica current $i_R$ flows to the circuit node 39 as the required load current $i_L$ flows away from this circuit node and a replica current $i_R$ flows from the circuit node 39 as the required load current $i_L$ flows towards this circuit node.

Finally, because the replica impedance $Z_R$ of the replica load 32 substantially equals the impedance $Z_L$ of the buffer load 22 and $V_{be}$ of the replica transistor 34 substantially equals $V_{be}$ of the buffer transistor 24, the replica currents $i_R$ at the circuit node 39 substantially match the required load currents $i_L$ at this node. The replica currents $i_R$ thus provide the required load currents $i_L$ and current conservation at the circuit node 39 requires that the current through the buffer transistor 24 equals the constant bias current I of the buffer current source 26.

Because its current is constant, the base-emitter voltage $V_{be}$ of the buffer transistor 24 is constant and distortion in the output signal across the buffer load 22 is significantly reduced. Although the buffer amplifier 20 includes three current sources, their currents I need only somewhat exceed the load current $i_L$. In contrast, power consumption is significantly greater in conventional buffers because they must substantially increase the current of the buffer current source (26 in FIGS. 2A and 2B) above the load current $i_L$ to achieve acceptable linearity.

Figure 3:
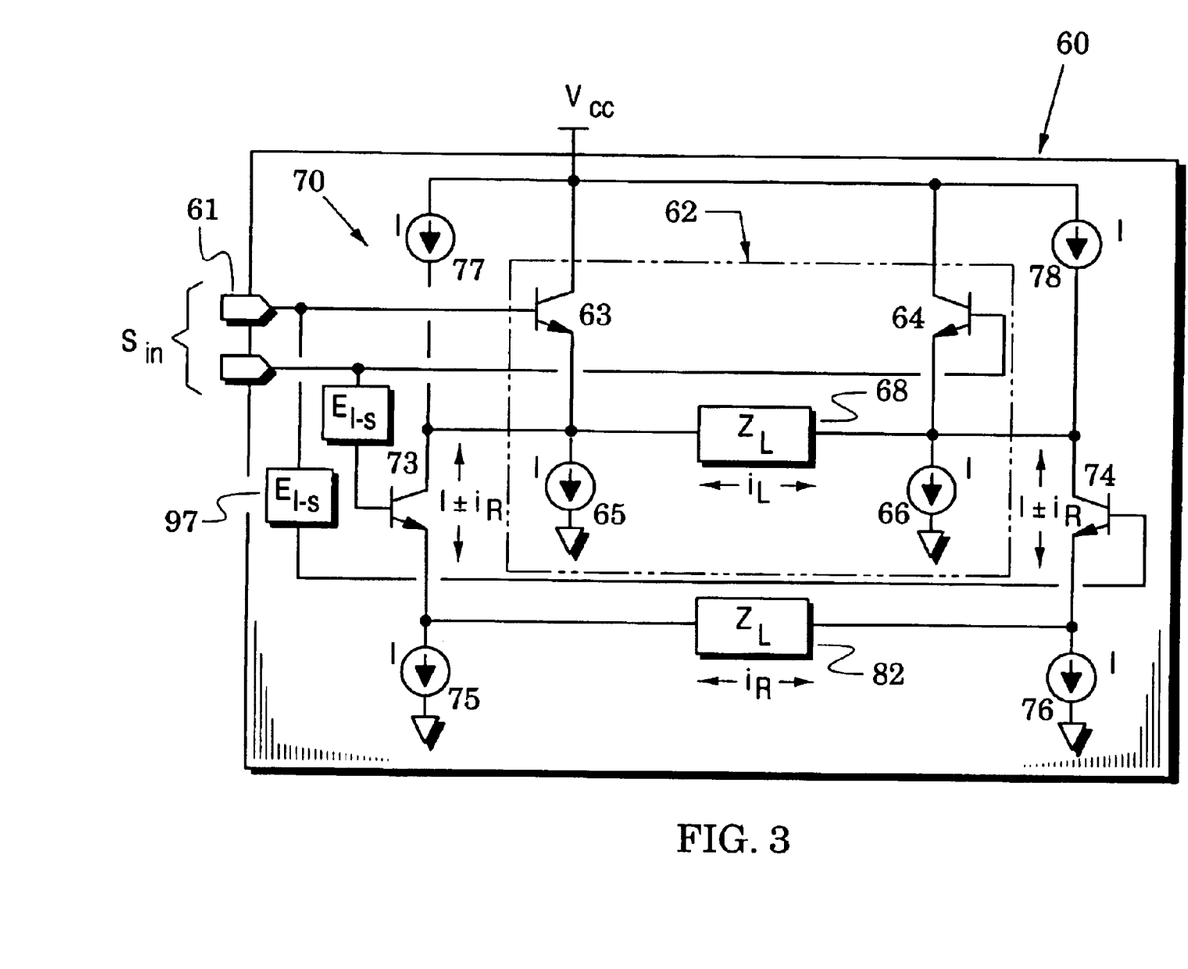
FIG. 3 is a schematic of a differential buffer amplifier embodiment of the invention.

FIG. 3 illustrates a differential buffer amplifier embodiment 60 which provides substantial immunity to the effects of a common-mode component in the differential input signal $S_{in}$ at an input port 61.

This embodiment has a buffer portion 62 which includes first and second buffer transistors 63 and 64 and first and second buffer current sources 65 and 66 that are coupled to the emitters of respective buffer transistors. The emitters of the first and second buffer transistors are coupled to provide a load current $i_L$ through an output load 68 in response to a differential input signal $S_{in}$ that is received through the buffer transistors' bases from the input port 61.

The remainder of the buffer amplifier 60 comprises a replica current generator 70 which includes first and second replica transistors 73 and 74, first and second replica current sources 75 and 76 coupled to the emitters of respective replica transistors, third and fourth replica current sources 77 and 78 coupled to the collectors of respective replica transistors and a replica load 82.

The bases of the first and second replica transistors 73 and 74 are cross coupled (relative to the bases of the first and second buffer transistors 63 and 64) to the input port 61 and their emitters are coupled to drive a replica current $i_R$ through the replica load 82 in response to the differential input signal $S_{in}$.

The differential buffer amplifier 60 operates in a manner similar to that described above for the buffer amplifier 20 of FIGS. 2A and 2B except that it also provides significant rejection of a common-mode component of the input signal $S_{in}$ because the common-mode component appears across both ends of the output load 68 and both ends of the replica load 82 and does not generate any substantial common-mode current through these loads.

Attention is now redirected to the buffer amplifier 20 of FIG. 2A in which it is noted that the currents I of the second replica current source 37 and the buffer current source 26 respectively flow towards and away from the same circuit node 39. The second replica current source 37 and the buffer current source 26, therefore, can be removed without substantially affecting the operation of the buffer amplifier.

Figure 4:
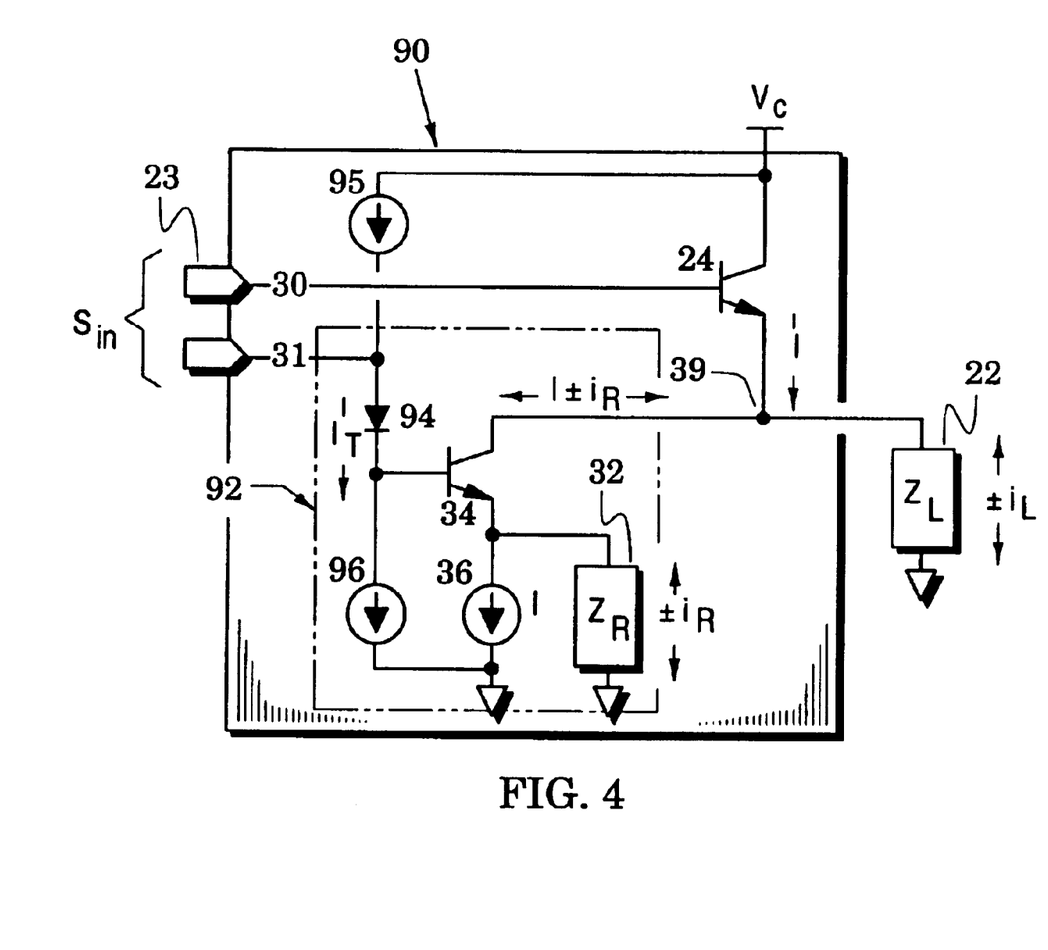
FIG. 4 is a schematic of another buffer amplifier embodiment.

Accordingly, FIG. 4 illustrates a buffer amplifier embodiment 90 which includes elements of the buffer amplifier 20 of FIG. 2A (with like elements indicated by like reference numbers) but which eliminates the second replica current source 37 and the buffer current source 26. This elimination alters the replica current generator 28 of FIG. 2A to the structure of the replica current generator 92 of FIG. 4.

In operation of the buffer amplifier 90, the input signal $S_{in}$ at the lower side 31 generates replica currents $\pm i_R$ in the replica load 32 so that currents through the replica transistor 34 are $I \pm i_R$ (as they were in the buffer amplifier 20 of FIGS. 2A and 2B). At the same time, the input signal $S_{in}$ at the upper side 32 generates load currents $\pm i_L$ in the replica load 32.

Because the replica impedance $Z_R$ of the replica load 32 substantially equals the impedance $Z_L$ of the buffer load 22, the replica currents $i_R$ at the circuit node 39 substantially provide the desired load currents $i_L$ and current conservation at the circuit node 39 requires that the current through the buffer transistor 24 substantially equals the constant bias current I of the buffer current source 26.

It is further noted that the bases of the buffer transistor 24 and replica transistor 34 share the same common-mode input signal and that the collector of the replica transistor 34 is depressed by the base-emitter voltage $V_{be}$ of the buffer transistor 24. Therefore, a level-shifting element $E_{l-s}$ is preferably inserted ahead of the replica transistor 34 to similarly depress its base potential and insure that operation of the replica transistor remains in its active region (i.e., not in its saturation region).

In FIG. 4, this level-shifting element $E_{l-s}$ is provided by a level-shifting diode 94 which receives a small trickle current $I_T$ from two trickle current sources 95 and 96 coupled between $V_c$ and ground. Level shifting elements 97 are also shown in the control terminals of replica transistors in FIGS. 2A, 2B and 3. Rather than depress this control terminal in other buffer amplifier embodiments, it is noted that the level shifting can also be realized by elevating the control terminal of the buffer transistor (24 in FIG. 2A).

Figure 5:
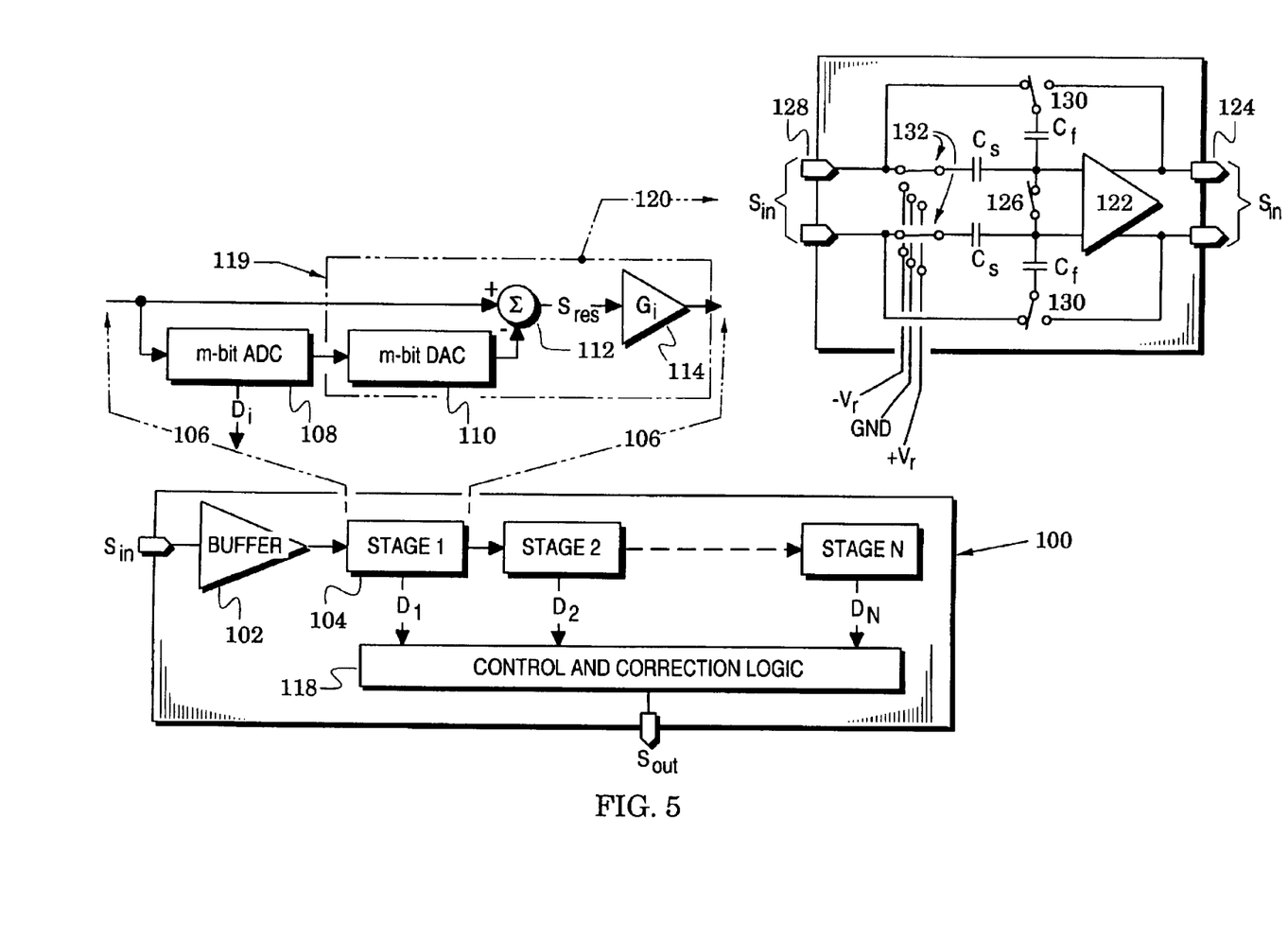
FIG. 5 is a block diagram of a pipelined analog-to-digital converter which includes a schematic of a switched-capacitor multiplying digital-to-analog converter.

Buffer amplifiers of the invention are suitable for use in a variety of signal-conditioning systems such as the exemplary pipelined analog-to-digital converter (ADC) 100 of FIG. 5 which includes a buffer amplifier 102 that provides an analog input signal $S_{in}$ to N cascaded converter stages 104 that convert samples of the to input signal $S_{in}$ to a corresponding digital output signal $S_{out}$.

Each pipelined stage converts a respective analog signal to that stage's predetermined number of digital bits and passes an amplified residue signal $S_{res}$ to a succeeding converter stage. As the succeeding converter stage converts its received residue signal $S_{res}$ in a similar manner, the preceding stage is converting a succeeding analog input signal. All converter stages, therefore, are simultaneously converting succeeding analog input signals to their respective digital bits with final converted words issuing at the same rate as the sampling rate of input analog signals.

Broken expansion lines 106 in FIG. 1 indicate that an exemplary initial converter stage comprises an n-bit ADC 108 which provides at least a corresponding digital bit $D_1$ and also comprises an n-bit digital-to-analog (DAC) 110 that converts these bits to an analog signal which is subtracted in a summer 112 from this stage's respective analog input to form an analog residue $S_{res}$ that is amplified in a respective amplifier 114 with a respective gain G and passed to a successive converter stage.

Generally, one or more redundant bits are generated and a control and correction logic 118 includes circuits (e.g., full adders) that use the bits of succeeding stages to correct preceding-stage errors that result from various degrading effects (e.g., offset and/or gain errors) and also includes circuits (e.g., shift registers) that time-align the corresponding digital bits The m-bit DAC 110, the summer 112 and the amplifier 114 are generally referred to as a multiplying digital-to-analog converter (MDAC) which is collectively shown as the broken-line element 119 in FIG. 5. An exemplary arrow points from the MDAC 119 to indicate a particularly useful MDAC configuration 120 which is formed with a differential amplifier 122 that is coupled between a differential output port 124 and pairs of feedback capacitors $C_f$ and sample capacitors $C_s$. Bottom plates of the feedback capacitors and sample capacitors are coupled together through a switch 126 and top plates of the feedback capacitors and the sample capacitors are respectively coupled to a differential input port 128 through switches 130 and multi-pole switches 132.

The switches 126, 130 and 132 are shown in a sample mode of the switched-capacitor MDAC 120 in which a sample of the input signal is stored as electrical charges on the feedback capacitors $C_f$ and sample capacitors $C_s$. In an amplify mode, switch 126 is opened and switches 130 couple the top plates of the feedback capacitors $C_f$ to the differential output port 124 (i.e., they are coupled across the differential amplifier 122).

In this amplify mode, the multi-pole switches 132 couple the bottom plates of the sample capacitors to $-V_r$, ground or $+V_r$ in response to corresponding decisions by the n-bit ADC 108 wherein $-V_r$ and $+V_r$ are reference voltages that define the input limits of the ADC 108. This switch configuration is appropriate for a 1.5 bit ADC stage and is exemplary of other switch configurations that are appropriate for different stages.

It is apparent that the accuracy of the ADC 100 of FIG. 5 depends upon the ability of the buffer 102 to drive currents into the feedback capacitors $C_f$ and sample capacitors $C_s$ during the sample mode of the MDAC 120. At the same time, the buffer 102 should faithfully reproduce the input signal $S_{in}$ at the bottom plates of the feedback capacitors and sample capacitors.

It is noted that, during the sample mode, the switches 130 and feedback capacitors $C_f$ are in parallel with corresponding ones of the switches 132 and the sample capacitors $C_s$ to thereby form a series circuit consisting of two capacitors coupled between a central switch and two external switches. This capacitive load arrangement is shown as the buffer load 142 in the buffer amplifier embodiment 140 of FIG. 6 which is otherwise similar to the buffer amplifier embodiment 60 of FIG. 3 with like elements indicated by like reference numbers.

Figure 6:
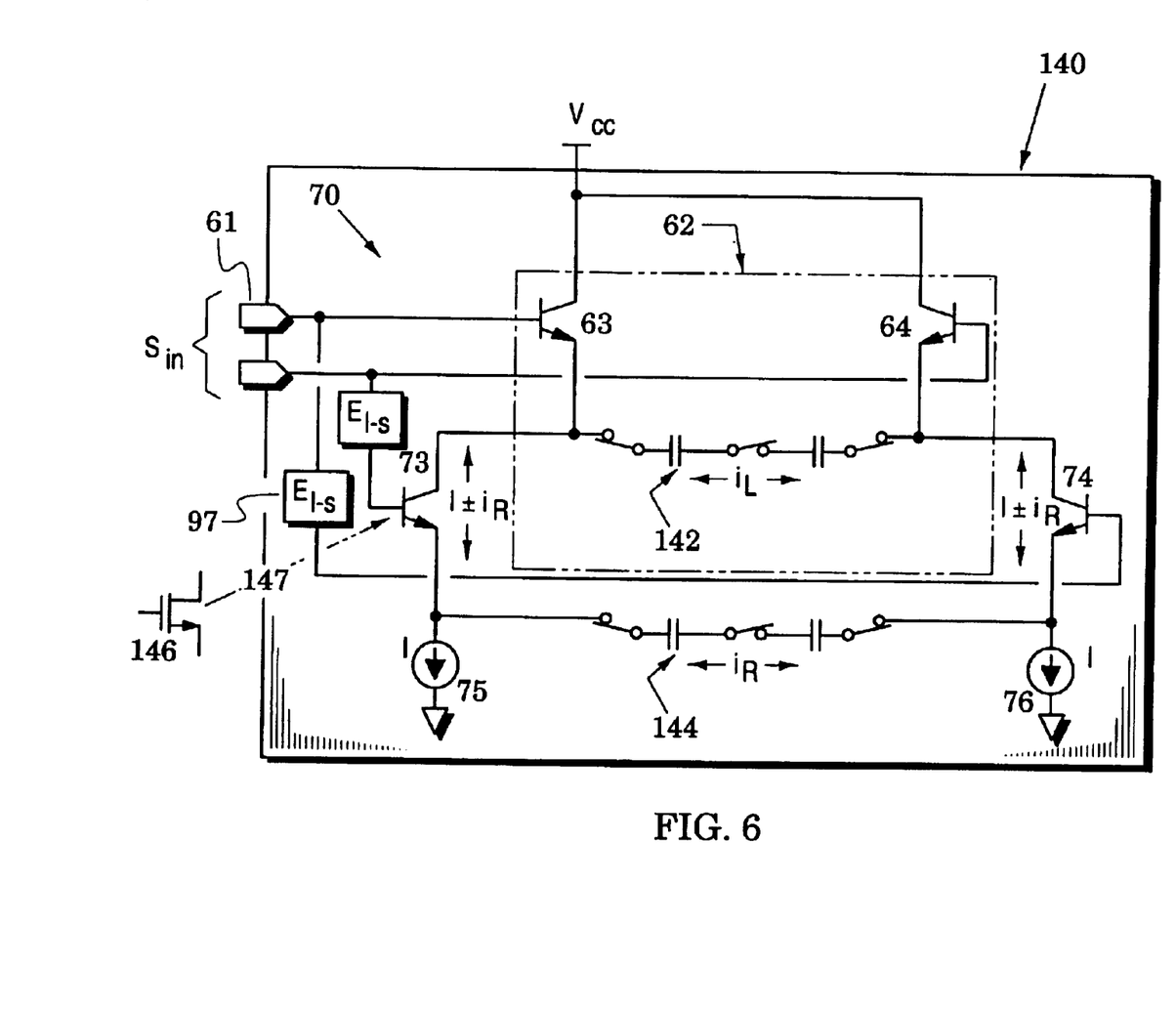
FIG. 6 is a schematic that illustrates an application of the differential buffer amplifier embodiment of FIG. 3 in the pipelined analog-to-digital converter of FIG. 5.

As stated above, it is important that the impedance of the replica load substantially matches the impedance of the buffer load and, accordingly, a similar capacitive load arrangement is inserted as the replica load 144. When the buffer amplifier embodiment 140 is used as the buffer 102 in FIG. 5, it will thus supply the currents required to drive the MDAC 120 and faithfully reproduce the input signal $S_{in}$ at the top plates of the feedback capacitors $C_f$ and sample capacitors $C_s$.

It was shown above with reference to the buffer amplifier 90 of FIG. 4, that the second replica current source (37 in FIG. 2A) and the buffer current source (26 in FIG. 2A) can be removed without substantially affecting the operation of the buffer amplifier. Accordingly, the second replica current sources and buffer current sources (77 and 65) of the buffer amplifier 60 of FIG. 3 are also eliminated in the buffer amplifier 140.

Simulations have been conducted with a conventional buffer and a buffer amplifier in accordance with the invention each driving a switched-capacitor MDAC. With a 2 volt peak-to-peak, 505 MHz input sine wave and a 100 Msamples/second sampling frequency, it was found that the output spectrum of the conventional buffer exhibited a spurious free dynamic range (SFDR) of approximately 54 dB and the output spectrum of the invention's buffer exhibited an SFDR of approximately 81.4 dB. Although bias currents (e.g., current of the buffer current source 26 in FIG. 2A) can be significantly increased in conventional buffers to realize SFDR performance that approaches that of the invention, this further increases their power consumption over that of the invention's buffer, Structures of the invention have been described with reference to bipolar junction transistors but the teachings of the invention can be practiced with various transistor types. As is well known, transistors generally have a control terminal and first and second current terminals that are responsive to the control terminal.

Therefore, the teachings can be practiced, for example, with bipolar junction transistors in which the control terminal is a base and the first and second current terminals are emitters and collectors and with metal-oxide semiconductor (MOS) transistors in which the control terminal is a gate and the first and second current terminals are sources and drains. The equivalent use of MOS transistors, for example, is indicated in FIG. 6 by the MOS transistor 146 which is substituted for the bipolar junction transistor 73 as indicated by substitution arrow 147.

Although buffer amplifiers of the invention have been illustrated, for simplicity of description, as responding to differential input signals, other buffer embodiments may respond to single-ended input signals. For example, replacement arrow 150 in FIG. 1 indicates that the differential input signal at the differential input port 23 can be replaced with a single-ended input signal, a single-ended input port 151 and an inverter 152. In the description of FIG. 1, the differential input signal was described as having upper and lower sides 30 and 31. With this single-ended replacement, the single-ended input signal provides the upper side 30 and the inverter 152 responds to the upper side and provides the lower side 31.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A buffer amplifier that drives an output load in response to an input signal, comprising:

a buffer transistor having a buffer control terminal and first and second buffer current terminals responsive to said buffer control terminal wherein said first buffer current terminal is available to provide a load current to said output load when said buffer control terminal receives said input signal; and a replica current generator coupled to provide a replica current substantially equal to said load current to said first buffer current terminal in response to said input signal;

wherein said replica current generator includes:

a replica transistor having a replica control terminal and first and second replica current terminals responsive to said replica control terminal wherein said replica control terminal receives said input signal and said second replica current terminal is coupled to said first buffer current terminal;

a replica current source coupled to said first replica current terminal; and a replica load coupled to said first replica current terminal;

wherein said second replica current terminal provides said replica current when said replica control terminal receives said input signal.

2. The amplifier of claim 1, further including a buffer current source coupled to said first buffer current terminal and wherein said replica current generator further includes a second replica current source coupled to said second replica current terminal.

3. The amplifier of claim 2, wherein said buffer current source, said first replica current source and said second replica current source generate substantially equal currents.

4. The amplifier of claim 1, wherein said output load has an output impedance and said replica load has a replica impedance substantially equal to said output impedance.

5. The amplifier of claim 1, wherein said output load includes a load capacitor with a load capacitance and said replica load includes a replica capacitor with replica capacitance substantially equal to said load capacitance.

6. The amplifier of claim 1, wherein said buffer control terminal and said replica control terminal are bases, said first buffer current terminal and said first replica current terminal are emitters and said second buffer current terminal and said second replica current terminal are collectors.

7. The amplifier of claim 1, wherein said buffer control terminal and said replica control terminal are gates, said first buffer current terminal and said first replica current terminal are sources and said second buffer current and said second replica current terminal are drains.

8. The amplifier of claim 1, further including a level-shifting element inserted in series with said replica control terminal.

9. The amplifier of claim 1, wherein said input signal is a differential input signal and said buffer control terminal receives one side of said differential input signal and said replica control terminal receives the other side of said differential input signal.

10. A buffer amplifier that drives an output load in response to an input signal, comprising:

first and second buffer transistors that each have a buffer control terminal and first and second buffer current terminals responsive to said buffer control terminal wherein said first buffer current terminals are available to provide a load current through said output load when said buffer control terminals differentially receive said input signal; and a replica current generator coupled to provide a replica current substantially equal to said load current to the first buffer current terminals of said first and second buffer transistors in differential response to said input signal.

11. The amplifier of claim 10, wherein said replica current generator includes:

first and second replica transistors that each have a replica control terminal and first and second replica current terminals responsive to said replica control terminal wherein the replica control terminals of said first and second replica transistors differentially receive said input signal and wherein each second replica current terminal of said first and second replica transistors is respectively coupled to a first buffer current terminal of said first and second buffer transistors;

first and second replica current sources respectively coupled to the first replica current terminals of said first and second replica transistors; and a replica load coupled between the first replica current terminals of said first and second replica transistors;

wherein said second replica current terminals provide said replica current when said replica control terminals differentially receive said input signal.

12. The amplifier of claim 11, wherein said replica current generator further includes:

first and second buffer current sources respectively coupled to the first buffer current terminals of said first and second buffer transistors; and third and fourth replica current sources respectively coupled to the second replica current terminals of said first and second replica transistors.

13. The amplifier of claim 11, wherein said output load has an output impedance and said replica load has a replica impedance substantially equal to said output impedance.

14. The amplifier of claim 11, wherein said output load includes a load capacitor with a load capacitance and said replica load includes a replica capacitor with replica capacitance substantially equal to said load capacitance.

15. The amplifier of claim 11, wherein the buffer control terminals of said first and second buffer transistors and the replica control terminals of said first and second replica transistors are bases, the first buffer current terminals of said first and second buffer transistors and the first replica current terminals of said first and second replica transistors are emitters and the second buffer current terminals of said first and second buffer transistors and the second replica current terminals of said first and second replica transistors are collectors.

16. The amplifier of claim 11, wherein the buffer control terminals of said first and second buffer transistors and the replica control terminals of said first and second replica transistors are gates, the first buffer current terminals of said first and second buffer transistors and the first replica current terminals of said first and second replica transistors are sources and the second buffer current terminals of said first and second buffer transistors and the second replica current terminals of said first and second replica transistors are drains.

17. The amplifier of claim 11, further including first and second level-shifting elements respectively inserted in series with the replica control terminals of said first and second replica transistors.

18. A pipelined analog-to-digital converter that processes an input signal to a corresponding digital signal, comprising:

an initial converter stage that processes samples of said differential input signal to provide a residue signal and respective bits of said digital signal;

at least one successive converter stage that processes a preceding residue signal to provide a successive residue signal and respective bits of said digital signal wherein a final converter stage only provides said respective bits;

in at least said initial converter stage, a multiplying digital-to-analog converter (MDAC) which includes a series load of at least one capacitor and at least one switch to obtain a sample of said input signal and process said sample into said residue signal; and a buffer amplifier that drives said load in response to said differential input signal and includes:

a) first and second buffer transistors that each have a buffer control terminal and first and second buffer current terminals responsive to said buffer control terminal wherein said first buffer current terminals are available to provide a load current through said load when said buffer control terminals differentially receive said input signal;

b) first and second replica transistors that each have a replica control terminal and first and second replica current terminals responsive to said replica control terminal wherein the replica control terminals of said first and second replica transistors receive said input signal and each second replica current terminal of said first and second replica transistors is respectively coupled to a first buffer current terminal of said first and second buffer transistors and each;

c) first and second replica current sources respectively coupled to the first replica current terminals of said first and second replica transistors; and d) a replica load coupled between the first replica current terminals of said first and second replica transistors;

wherein said second replica current terminals provide said replica current when said replica control terminals differentially receive said input signal.

19. The converter of claim 18, wherein said load has an output impedance and said replica load has a replica impedance substantially equal to said output impedance.

20. The converter of claim 18, further including first and second level-shifting elements respectively inserted in series with the replica control terminals of said first and second replica transistors.

* * * * *